(12) United States Patent
Rogers

(10) Patent No.: US 9,090,459 B2
(45) Date of Patent: Jul. 28, 2015

(54) CONTROL CIRCUITRY ROUTING CONFIGURATION FOR MEMS DEVICES

(71) Applicant: HARRIS CORPORATION, Melbourne, FL (US)

(72) Inventor: John E. Rogers, Vero Beach, FL (US)

(73) Assignee: Harris Corporation, Melbourne, FL (US)

( * ) Notice: Subject to any disclaimer, the term of this patent is extended or adjusted under 35 U.S.C. 154(b) by 414 days.

(21) Appl. No.: 13/689,899

(22) Filed: Nov. 30, 2012

(65) Prior Publication Data
US 2014/0152143 A1    Jun. 5, 2014

(51) Int. Cl.
*H02N 1/00*    (2006.01)
*B81C 1/00*    (2006.01)

(52) U.S. Cl.
CPC ......... *B81C 1/00182* (2013.01); *B81C 1/00095* (2013.01)

(58) Field of Classification Search
CPC ........ H02N 1/00; H02N 1/002; H02N 11/006
USPC ........ 310/309, 300, 308; 427/98.4, 98.5, 97.3
See application file for complete search history.

(56) References Cited

U.S. PATENT DOCUMENTS

| | | | |
|---|---|---|---|
| 7,012,489 B2 | 3/2006 | Sherrer et al. | |
| 7,898,356 B2 | 3/2011 | Sherrer et al. | |
| 2003/0232458 A1* | 12/2003 | Kleiman | 438/48 |
| 2005/0057329 A1* | 3/2005 | Shen et al. | 335/78 |
| 2007/0217956 A1* | 9/2007 | Pamula et al. | 422/100 |
| 2009/0026880 A1* | 1/2009 | Liu | 310/309 |

OTHER PUBLICATIONS

Sundaram, A., et al., "MEMS-Based Electronically Steerable Antenna Array Fabricated Using PCB Technology", Journal of Microelectromechanical Systems, vol. 17, No. 2, Apr. 2008, pp. 356-262.

* cited by examiner

*Primary Examiner* — Michael Andrews
(74) *Attorney, Agent, or Firm* — Robert J Sacco, Esq.; Fox Rothschild LLP

(57) ABSTRACT

A method for constructing a MEMS system includes first depositing on a surface of a substrate a first plurality of thin film layers formed of dielectric material. The first plurality of thin-film layers includes at least one conductive trace extending a distance on the substrate, parallel to the surface. A second plurality of layers is then deposited to form at least one MEMS device. The MEMS device is responsive to a control signal applied to a first input terminal and an electrical connection is formed from the conductive trace to the input terminal.

18 Claims, 9 Drawing Sheets

US 9,090,459 B2

CONTROL CIRCUITRY ROUTING CONFIGURATION FOR MEMS DEVICES

BACKGROUND OF THE INVENTION

1. Statement of the Technical Field

The inventive arrangements relate to wafer level RF devices and more particularly to control circuitry for devices used in microwave and millimeter wave communications.

2. Description of the Related Art

Many communication systems operate in high frequency bands. For example, communication systems operating at frequencies as high as 300 GHz are known. In these types of systems, certain benefits can be obtained from the use of three-dimensional microstructures to form RF circuits and components. It is known that such three dimensional microstructures can be formed by utilizing sequential build processes. For example, U.S. Pat. Nos. 7,012,489 and 7,898,356 describe methods for fabricating coaxial waveguide microstructures. These processes provide an alternative to traditional thin film technology, but also present new design challenges pertaining to their effective utilization for advantageous implementation of various RF devices.

SUMMARY OF THE INVENTION

A method for constructing a MEMS system includes first depositing on a surface of a substrate a first plurality of thin film layers formed of dielectric material. Included in the first plurality of thin-film layers is at least one conductive trace extending a distance on the substrate, parallel to the surface. The method further includes subsequently depositing over the plurality of thin-film layers a second plurality of layers. The second plurality of layers includes at least one layer each of a conductive material and a dielectric material to form at least one MEMS device. Accordingly, the conductive trace is formed on the substrate beneath the MEMS device. The MEMS device is constructed so that it is responsive to a control signal applied to a first input terminal. The method further involves forming an electrical connection from the at least one conductive trace to the input terminal.

BRIEF DESCRIPTION OF THE DRAWINGS

Embodiments will be described with reference to the following drawing figures, in which like numerals represent like items throughout the figures, and in which.

DETAILED DESCRIPTION

The invention is described with reference to the attached figures. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operation are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

Figure 1:
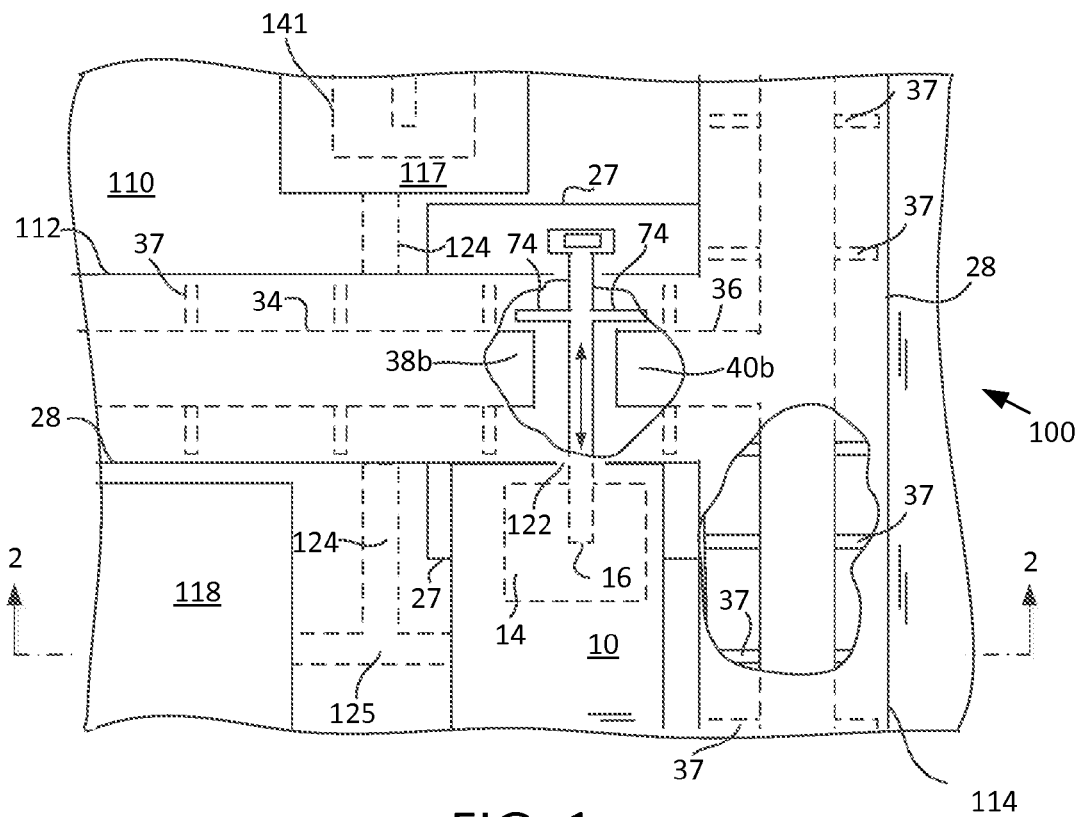
FIG. 1 is a perspective view of an exemplary system that is useful for understanding the invention.
Figure 2:
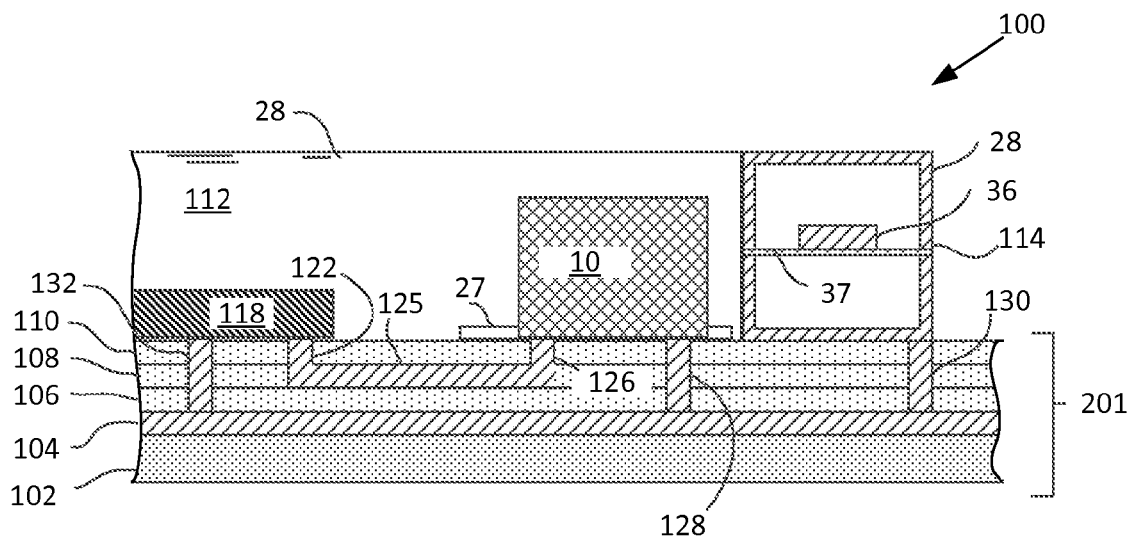
FIG. 2 is a cross-sectional view taken along line 2-2 in FIG. 1.

The invention concerns a method for constructing a system 100 as shown in FIGS. 1 and 2. The method involves depositing on a surface of a dielectric substrate 102 a plurality of layers to form a three-dimensional microstructure. The plurality of layers can include at least one layer each of a conductive material, a dielectric material, and a sacrificial material which are used to form at least one MEMS device 10, 117. The MEMS devices can be fabricated using known processing methods, such as those disclosed in U.S. Pat. Nos. 7,012, 489 and 7,898,356.

The MEMS devices 10, 117 can be disposed at least partially on a ground plane 27. In some embodiments, the three-dimensional microstructure deposited on a substrate 102 can include certain other devices such as radio frequency (RF) transmission lines 112, 114. As is known in the art, such transmission lines can include a ground housing 28 and first and second inner conductors 34, 36 disposed coaxially within the ground housing. The inner conductors can be supported by one or more dielectric cross-members 37.

The MEMS device is advantageously designed so that it can be responsive to a control signal. In some embodiments of the invention described herein, the control signal can be a DC voltage. Still, the invention is not limited in this regard and other types of control signals are also possible. A plurality of thin-film dielectric layers 104, 106, 108, 110 are formed on the substrate 102. Within the plurality of thin-film dielectric layers, one or more conductive traces 124, 125 are provided and which can extend a distance within the cross-section. More particularly, the one or more conductive traces can extend parallel to the major planar surface of the substrate 102, and can be connected to the at least one MEMS device 10 to facilitate communication of the control signal.

The MEMS device can include at least one actuator portion 14 (such as an electrostatic actuator). In such a scenario, the control signal advantageously provides a motive force for causing a movement of a shuttle 16 with the electrostatic actuator. A converter 118 mounted to the surface an uppermost layer of the substrate can be used for generating the control signal. For example the converter can be arranged to accept a first signal having a first voltage and to convert the first voltage to a second voltage to form the control signal. In the case where an electrostatic actuator is used in the MEMS device, a relatively high voltage DC signal is commonly needed for actuation purposes. In such a scenario, the first voltage and the second voltage can each be DC voltages and the second voltage can be substantially greater than the first voltage for purposes of driving the actuator. Notably, MEMS devices in the exemplary system described herein can include a shuttle 16 which is arranged to control a position of a conductive switch contact 136. The conductive switch contact is arranged so that it can be repositioned by the elongated body to selectively form an electrical connection (e.g. with a portion of the first inner conductor 34). Accordingly, it should be appreciated that the MEMS device can be a part of an RF switch.

With the arrangement as described herein the conductive traces can traverse beneath a portion of at least one MEMS device 10, 117. The conductive traces extend within the dielectric thin-film layers in a direction which is generally parallel to the surface of the substrate 102, and beneath the MEMS device.

The structure of the exemplary system 100 will now be described in further detail. Substrate 102 can be formed from high-electrical-resistivity aluminum nitrate (AlN), or from other dielectric materials, such as silicon (Si), glass, silicon-germanium (SiGe), or gallium arsenide (GaAs). The conductive layers and ground plane layer 104 are each formed of a highly conductive material such as copper (Cu). Of course, other conductive materials can be used for this purpose. The dielectric layers are formed of an electrically insulating dielectric material. Acceptable dielectric materials for this purpose include polyethylene, polyester, polycarbonate, cellulose acetate, polypropylene, polyvinyl chloride, polyvinylidene chloride, polystyrene, polyamide, polyimide, and benzocyclobutene. A wide variety of other dielectric materials can be acceptable provided that such materials are compatible with the manufacturing processes as hereinafter described.

In FIGS. 1 and 2, the MEMS device 10 is shown conceptually and in schematic form so as to avoid obscuring the invention. However, it should be understood that the MEMS device includes at least one electrostatic actuator portion 14. Any suitable MEMS device can be used in connection with the present invention. However, it is advantageous that the MEMS device be constructed using processing methods consistent with construction of other three-dimensional microstructures disposed on the dielectric sub-layers.

In the embodiment shown, the MEMS device 10 is an RF switch. As such, the electrostatic actuator portion 14 is configured to move shuttle 16 for opening and closing a contact. In the example shown in FIG. 1, the coaxial transmission line 112 includes a port 122 located in a wall of the ground housing 28. The port 122 is advantageously defined by an opening formed in the wall of the ground housing as shown. The shuttle 16 can pass through the opening defined by port 122. The shuttle 16 is preferably formed at least partially of a dielectric material and is configured so that it can be moved by actuator portion 14 in the direction of the arrows as shown. The movement of the shuttle 16 can cause conductive fingers 74 to physically engage inner conductor ends 38b, 40b respectively.

The conductive fingers 74 provide a switching function by opening or closing an RF circuit between the two inner conductor ends 38b, 40b. It should be understood that the switching arrangement shown is merely exemplary. Many other types of switching arrangements involving MEMS RF switching devices are also possible and all such switching arrangements are intended to be included within the scope of the present invention. For example, instead of moving the fingers 74 in the direction shown, the shuttle 16 can be cantilevered. In that case, the elongated body can move a contact element transversely with respect to the direction shown (i.e., up and down with respect to the substrate 102) to perform a similar switching function. The sequential build processes described above can be used to form the MEMS device 10.

The operation of the electrostatic actuator portion 14 included in MEMS device 10 can require a relatively high DC voltage. In order to provide this relatively high DC voltage, it can be advantageous to make use of a converter 118. The converter 118 can be in the form of a microcircuit chip which is configured for converting a first DC voltage to second DC voltage. For example, the converter 118 can be a DC-DC switching converter configured for generating a relatively high voltage DC output based on a lower voltage DC input. DC converters of this type are well known in the art and therefore will not be described here in detail. However, it should be noted that the converter 118 can be provided in the form of an integrated circuit chip which is bonded to an uppermost one of the dielectric layers which are disposed on the surface of substrate 102. For example, the converter 118 can be attached to the uppermost dielectric layer using a conventional controlled collapse chip connection (C4) method which is sometimes referred to as a flip chip bonding method.

The high voltage output from the converter 118 must be provided to the MEMS device in order to operate the electrostatic actuator portion 14. In a single MEMS device architecture including three-dimensional microstructures, this high voltage coupling can be accomplished with relative ease. For example, wire bonding methods can be used and/or one or more circuit traces can be disposed on an uppermost surface of a substrate 102. Still, as a particular system becomes more complex, routing of high voltage wiring becomes an issue. For example, it may be desirable to route high voltage signals from a single converter to a plurality of MEMS devices which include electrostatic actuators, all of which require a relatively high DC voltage in order to operate. For example an exemplary system 100 can include a second MEMS device 117 which includes an electrostatic actuator portion 141. The MEMS device 117 can be a switch or some other MEMS device including an actuator portion 141. In such embodiments, the various MEMS devices incorporating electrostatic actuators can be distributed at various locations on a substrate.

Notably, a relatively complex system including three-dimensional microstructures may have electrostatic actuators in devices provided at locations which are separated by various surface components. These surface components can include coaxial waveguides, RF switches, combiners, filters, couplers, phase shifters and so on. In fact, any other structure disposed on the surface of the substrate may be an obstacle to routing this high voltage wiring when using conventional methods. In order to overcome such limitations, an exemplary system 100 incorporating surface mounted three-dimensional RF microstructures and MEMS devices can include one or more thin-film layers 106, 108, 110 where control signal wiring can be integrated. For example, the thin-film layers in the system 100 can include one or more conductive traces 124, 125 on which relatively high voltage DC switching signals can be coupled from a DC to DC converter 118 to a device (such as MEMS device 10) incorporating an electrostatic actuator portion 14. These conductive traces can be disposed above the substrate 102 but beneath the surface mounted three-dimensional RF microstructures and/or MEMS devices. More particularly, thin-film dielectric layers 106, 108, 110 can be formed of dielectrics such as polyethylene, polyester, polycarbonate, cellulose acetate, polypropylene, polyvinyl chloride, polyvinylidene chloride, polystyrene, polyamide, polyimide, benzocyclobutene, SU-8, HD-4104 and so on. Conductive traces 124, 125 and a ground plane layer 104 can be formed of thin-film metals such as copper (Cu), gold (Au) and silver (Ag). The vias 122, 126, 128, 130 and 132 can also be comprised of a conductive material and are arranged to communicate DC voltages from traces 124, 125 and ground plane 104 to the appropriate components at the surface of the system. Notably, the conductive traces 124, 125 can facilitate dense routing networks for communicating control signals for a plurality of MEMS devices included in the system.

Sequential build processes can be used to form the three-dimensional microstructures as described herein. For example, a thick film process for fabricating various coaxial waveguide microstructures is disclosed in U.S. Pat. Nos. 7,012,489 and 7,898,356. Micro electromechanical systems (MEMS) are well known in the art. Such devices comprise very small machines which can include mechanical and electrical components working cooperatively to perform a desired function. The methods and techniques conventionally used for fabrication of MEMS are based on process technology normally associated with device fabrication methods used in the semiconductor field. Thus, the fabrication of a typical MEMS device can include steps involving deposition of material layers, patterning by photolithography and etching to produce the required components of the device. Notably, the material processing methods disclosed in U.S. Pat. Nos. 7,012,489 and 7,898,356 for coaxial waveguide construction can also be used for MEMS fabrication. For example, these processing techniques can be applied for purposes of fabricating MEMS type RF switches. RF switches using these types of processing techniques are disclosed in U.S. patent application Ser. No. 13/623,188 (filed Sep. 20, 2012) and Ser. No. 13/592,435 (filed Aug. 23, 2012) by John E. Rogers. The disclosure of each of these patent applications is hereby incorporated herein by reference.

Referring now to FIGS. 3-9, there is provided a thick film process for fabricating an RF circuit 100 including three-dimensional RF microstructures, MEMS devices and conductive routing traces. The system can be manufactured using processing techniques which are similar to those used for creating three-dimensional microstructures, including coaxial transmission lines. As will be understood, the sub-layers are deposited on substrate 102 prior to development of the three-dimensional micro-structures on the surface. Each layer can have a thickness of, for example, approximately 1 μm.

Figure 3:
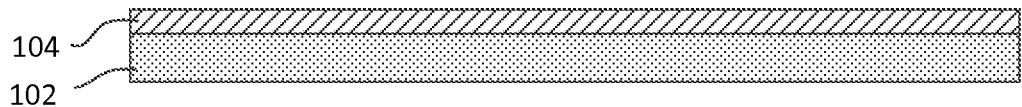
FIGS. 3-9 show a series of processing steps which can be used to construct a substrate for the exemplary system in FIGS. 1 and 2.

The process can begin as shown in FIG. 3 by depositing and patterning one or more layers of a metal such as copper (Cu), gold (Au) or silver (Ag) to establish ground plane layer 104. The ground plane layer 104 is part of a first or lowermost layer of the electrically-conductive material. The number of layers of the electrically-conductive material is applicant-dependent, and can vary with factors such as the complexity of the design, hybrid or monolithic integration of other devices, the overall height ("z" dimension) of the system, the thickness of each layer, etc.

Figure 4:
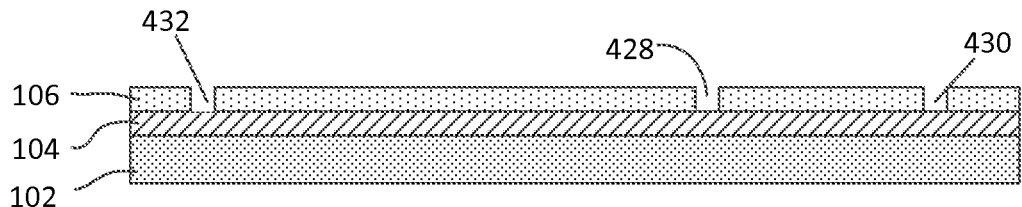

As shown in FIG. 4, a dielectric material such as polyethylene, polyester, polycarbonate, cellulose acetate, polypropylene, polyvinyl chloride, polyvinylidene chloride, polystyrene, polyamide, polyimide, benzocyclobutene, SU-8, or HD-4104 is deposited and patterned to form layer 106. The photoresist layer is deposited using a photo-definable, or photoresist masking material on the upper surface of layer 104, then exposed with ultra-violet light and developed to form layer 106.

Figure 5:
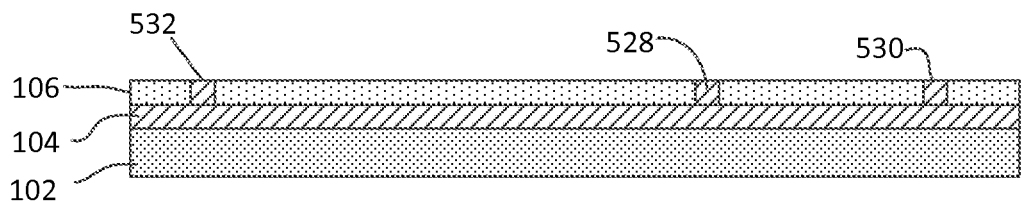

Electrically-conductive material is subsequently deposited in the exposed portions 428, 430, 432 to a predetermined thickness, to form conductive via portions 528 530, and 532 as shown in FIG. 5. The deposition of the electrically-conductive material is accomplished using a suitable technique such as chemical vapor deposition (CVD). Other suitable techniques, such as physical vapor deposition (PVD), sputtering, or electroplating, can be used in the alternative. The upper surfaces of the newly-formed layer 106 can be planarized using a suitable technique such as chemical-mechanical planarization (CMP).

Figure 6:
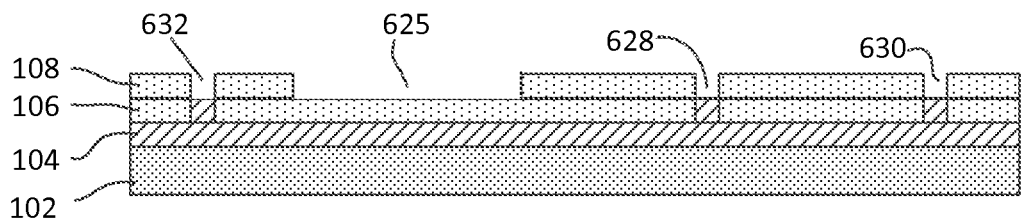
Figure 7:
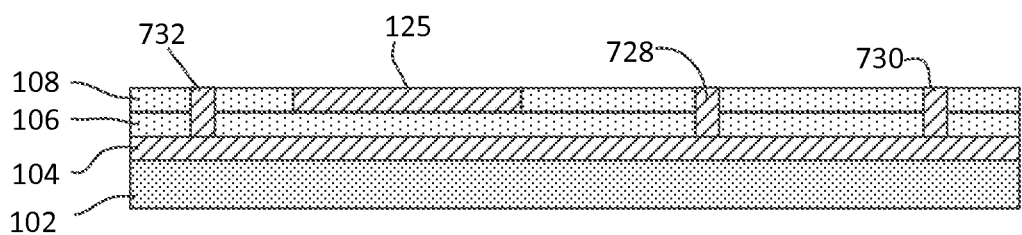

Referring now to FIG. 6, a dielectric material is deposited and patterned to form layer 108 in the manner previously described with regard to layer 106. As such, layer 108 can include exposed portions 625, 628, 630 and 632. The dielectric material in layer 108 can be formed of the same or a different dielectric material as layer 106. Thereafter electrically-conductive material is deposited in the exposed portions 625, 628, 630 and 632 to a predetermined thickness, to form conductive via portions 728 730, and 732 as shown in FIG. 7. Similarly, the electrically conductive material can be used to form conductive trace 125. Although it is not shown in FIGS. 6 and 7, electrically conductive material can also be used at this point to form other conductive traces, such as conductive trace 124. The electrically conductive material for these elements can be deposited using techniques similar to those described above with regard to layer 106.

Figure 8:
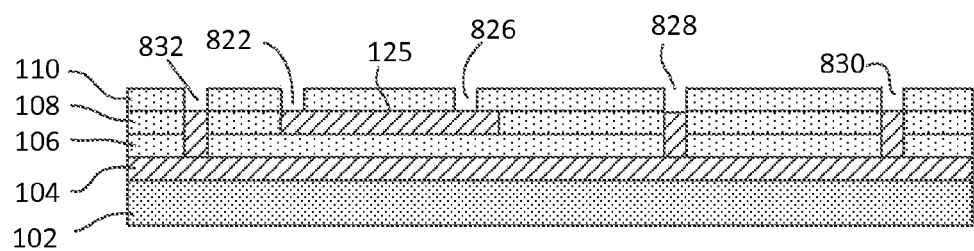
Figure 9:
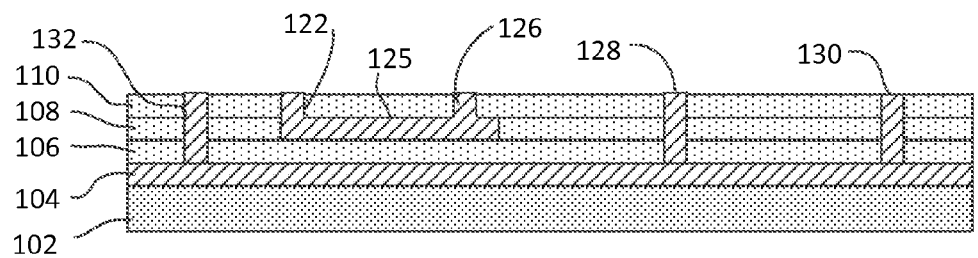

Referring now to FIGS. 8 and 9, a dielectric material is deposited and patterned to form layer 110 which includes exposed portions 822, 826, 828, 830, and 832. The dielectric material in layer 110 can be formed and patterned in a manner similar to layers 106 and 108. Also, the layer 110 can be formed of the same or a different dielectric material as layer 106 and 108. Subsequent to patterning layer 110, electrically-conductive material is deposited in the exposed portions 822, 826, 828, 830, and 832 to a predetermined thickness, to complete the formation of conductive vias 122, 126, 128, 130 and 132 as shown in FIG. 9. The deposition of the electrically-conductive material is accomplished using a suitable technique similar to those described above with respect to layers 106 and 108.

At the completion of the processing described with respect to FIG. 9, fabrication on the substrate 102 containing the various thin-film layers is completed. The substrate is now ready for processing to begin for purposes of forming the three-dimensional micro-structures and MEMS devices on the surface of the substrate. It should be understood that the foregoing process is intended to be exemplary of the manner in which one or more conductive traces can be provided in thin-film layers on a substrate 102 on which three-dimensional microstructures are to be fabricated. The process method used to form the thin-film layers, conductive traces and vias is similar to the techniques that are used to form the three-dimensional micro-structures and MEMS devices which are formed on the substrate. For example, these structures can be formed of the same materials and using the same processing methods. Also, it should be understood that the substrate can include additional layers in which many more conductive traces can be formed for purposes of routing signals that are needed by various three-dimensional microstructures and/or MEMS devices on the surface.

Figure 10:
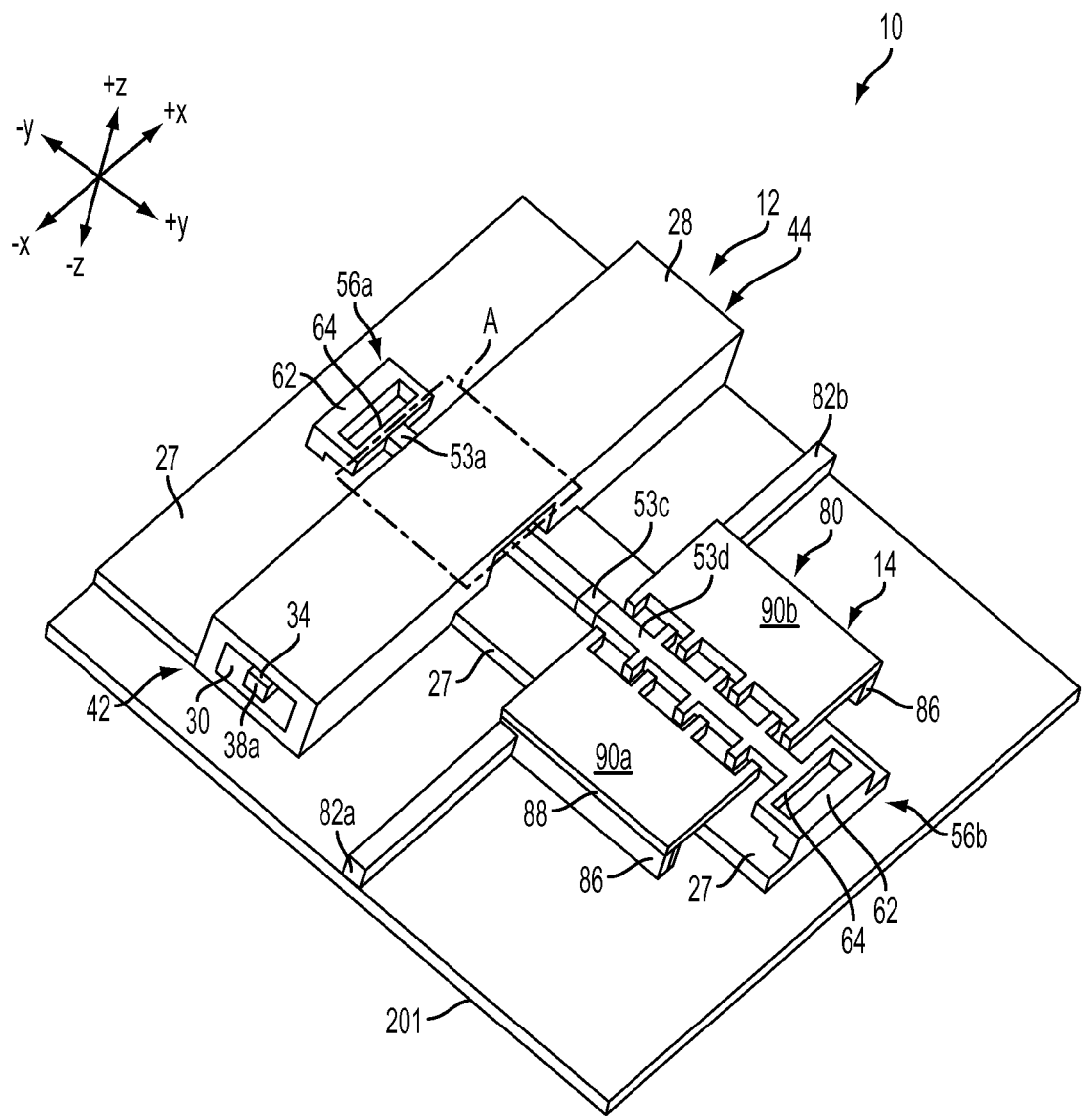
FIG. 10 is a perspective view of a MEMS device which can be used in the present invention.

Referring now to FIG. 10, the exemplary MEMS device 10 shall now be described in further detail. MEMS device 10 in this embodiment is presented as an RF switch, but it should be understood that it is merely one possible embodiment of a MEMS device as described herein. The MEMS device 10 can selectively establish and disestablish electrical contact between a first and second electronic component (not shown) electrically connected thereto. The MEMS device 10 has a maximum height ("z" dimension) of approximately 1 mm; a maximum width ("y" dimension) of approximately 3 mm; and a maximum length ("x" dimension) of approximately 3 mm. The MEMS device 10 is described as a MEMS switch having these particular dimensions for exemplary purposes only. Alternative embodiments of the device can be scaled up or down in accordance with the requirements of a particular application, including size, weight, and power (SWaP) requirements.

The MEMS device 10 comprises a contact portion 12, an actuator portion 14, and a shuttle 16, as shown in FIG. 10. The first and second electronic components are electrically connected to opposite ends of the contact portion 12, and are electrically connected to each other on a selective basis via the contact portion 12. As discussed below, the shuttle 16 moves in the "y" direction between an open and a closed position, in response to energization and de-energization of the actuator portion 14. The shuttle 16 facilitates the flow of electric current through the contact portion 12 when the shuttle 16 is in its closed position, thereby establishing electrical contact between the first and second electronic components. Current does not flow through the contact portion 12 when the shuttle 16 is in its open position. Thus, the first and second electronic components are electrically isolated from each other when the shuttle 16 is in its open position.

The MEMS device 10 comprises a substrate 102 formed from a dielectric material such as silicon (Si). The substrate 102 can be formed from other materials, such as glass, silicon-germanium (SiGe), or gallium arsenide (GaAs) in alternative embodiments. A plurality of layers 102, 104, 106, 108 can be disposed on the substrate as described to form a base assembly 201. The base assembly The MEMS device 10 also includes a ground plane 27 disposed on the substrate. The MEMS device 10 is formed from five layers of an electrically-conductive material such as copper (Cu). Each layer can have a thickness of, for example, approximately 50 µm. The ground plane 27 is part of a first or lowermost layer of the electrically-conductive material disposed on the base assembly 201. The number of layers of the electrically-conductive material used to form the MEMS device is applicant-dependent, and can vary with factors such as the complexity of the design, hybrid or monolithic integration of other devices with the MEMS device 10, the overall height ("z" dimension) of the MEMS device 10, the thickness of each layer, etc.

The contact portion 12 of the MEMS device 10 includes an electrically-conductive ground housing 28 disposed on the ground plane 27. The ground housing 28 is formed from portions of the second through fifth layers of the electrically-conductive material. The ground housing 28 and the underlying portion of the ground plane 27 define an internal channel 30 that extends substantially in the "x" direction, as depicted in FIG. 10.

Figure 11:
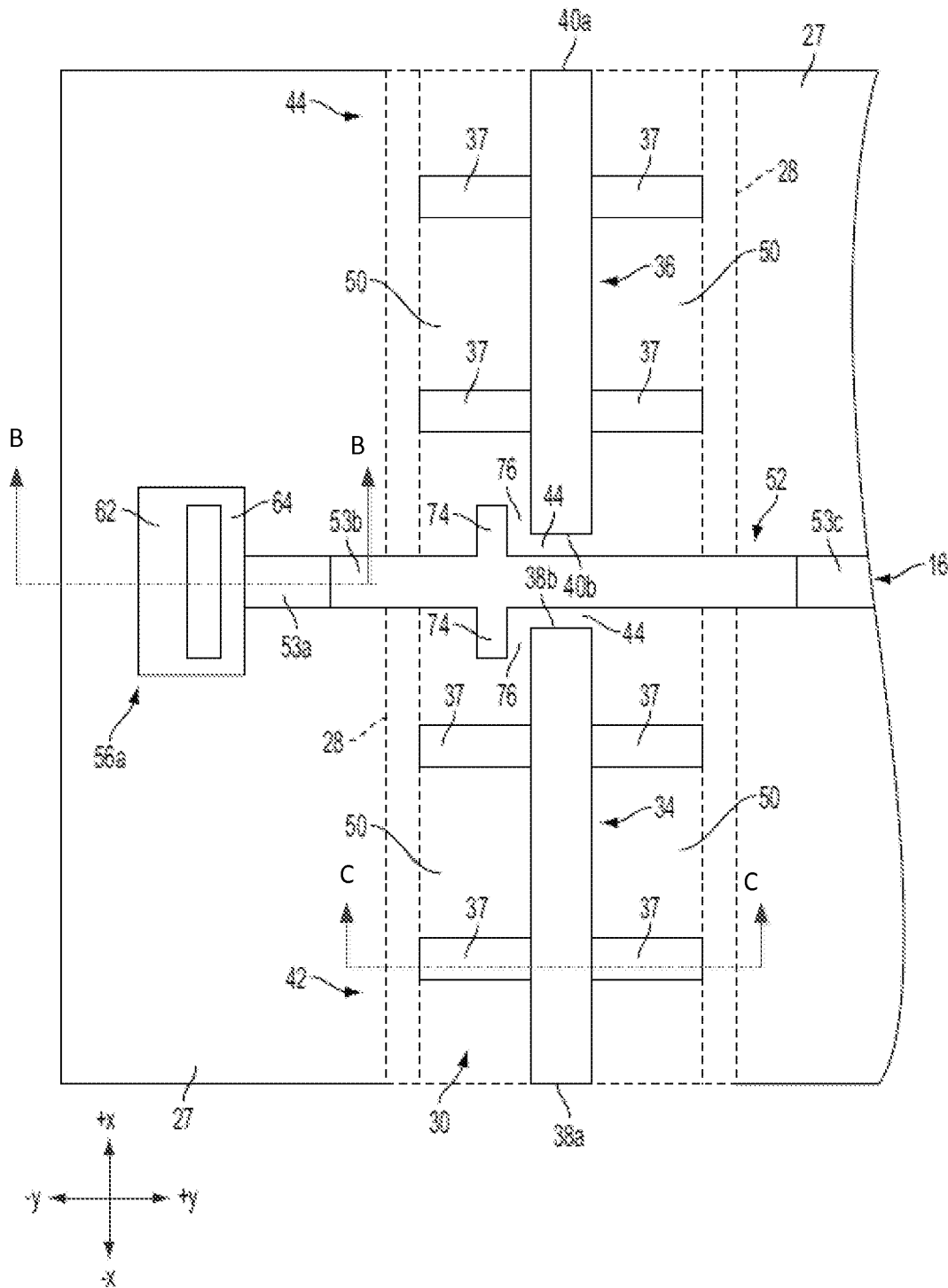
FIG. 11 is a top view of a portion of the MEMS device in FIG. 21.

The contact portion 12 further includes the electrically-conductive first inner conductor 34 and the electrically-conductive second inner conductor 36 each having a substantially rectangular cross section, as shown in FIGS. 10 and 11. The first and second inner conductors 34, 36 can each be formed as part of the third layer of the electrically-conductive material.

The first and second inner conductors 34, 36 are positioned within the channel 30, as shown in FIGS. 10 and 11. A first end 38a of the first inner conductor 34 is positioned at a first end of the channel 30. A first end 40a of the second inner conductor 36 is positioned at a second end of the channel 30. A second end 38b of the first inner conductor 34 is spaced apart from a second end 40b of the second inner conductor 36 by an air gap 44, and as discussed below, by a portion of the shuttle 16 positioned within the air gap 44.

The first inner conductor 34 and the surrounding portion of the ground housing 28 define an input port 42 of the contact portion 12. The second inner conductor 36 and the surrounding portion of the ground housing 28 define an output port 44 of the contact portion 12. The first electronic device can be electrically connected to the input port 42. The second electronic device can be electrically connected to the output port 44.

The first and second inner conductors 34, 36 are each suspended within the channel 34 on electrically-insulative cross-members 37. The cross-members 37 are formed from a dielectric material. For example, the cross-members 37 can be formed from polyethylene, polyester, polycarbonate, cellulose acetate, polypropylene, polyvinyl chloride, polyvinylidene chloride, polystyrene, polyamide, polyimide, benzocyclobutene, SU8, etc., provided the material will not be attacked by the solvent used to dissolve the sacrificial resist during manufacture of the MEMS device 10 as discussed. The cross-members 37 can each have a thickness of, for example, approximately 15 µm. Each cross-member 37 spans the width, i.e., y-direction dimension, of the channel 30. The ends of each cross-member 37 are sandwiched between the portions of the second and third layers of electrically-conductive material that form the sides of the ground housing 28. The first and second inner conductors 34, 36 are surrounded by, and are spaced apart from the interior surfaces of the ground housing 28 by an air gap 50. The air gap 50 acts as a dielectric that electrically isolates the first and second inner conductors 34, 36 from the ground housing 28. The type of transmission-line configuration is commonly referred to as a "recta-coax" configuration, otherwise known as micro-coax.

The shuttle 16 has an elongated body 52 that extends substantially in the "y" direction, as shown in FIGS. 10 and 11. The body 52 includes an electrically-insulative first portion 53a, and an adjoining, electrically-conductive second portion 53b. The body 52 also includes an electrically-insulative third portion 53c that adjoins the second portion 53b, and an electrically-conductive fourth portion 53d that adjoins the third portion 53c. The electrically-conductive second and fourth portions 53b, 53d of the body 52 are formed as part of the third layer of the electrically-conductive material. The electrically-insulative first and third portions 53a, 53c are formed from a dielectric material such as polyethylene, polyester, polycarbonate, cellulose acetate, polypropylene, polyvinyl chloride, polyvinylidene chloride, polystyrene, polyamide, polyimide, benzocyclobutene, SU8, etc., provided the material will not be attacked by the solvent used to dissolve the sacrificial resist during manufacture of the MEMS device 10 as discussed herein.

The MEMS device 10 includes a first mount 56a and a substantially identical second mount 56b. The first mount 56a is disposed on the portion of the ground plane 27 associated with the contact portion 12 of the MEMS device 10. The second mount 56b is disposed on the portion of the ground plane 27 associated with the actuator portion 14 of the MEMS device 10.

The first and second mounts 56a, 56b each include a base 62 that adjoins the ground plane 27, and a beam portion 64 that adjoins the base 62. Each base 62 is formed as part of the second and third layers of the electrically-conductive material. The beam portions 64 are formed as part of the third layer of the electrically-conductive material. It should be noted that the configuration of the beam portions 64 is application-dependent, and can vary with factors such as the amount of space available to accommodate the beam portions 64, the required or desired spring constant of the beam portions 64, etc. Accordingly, the configuration of the beam portions 64 is not limited to that depicted in FIG. 10.

An end of the first portion 53a of the shuttle 16 adjoins the beam portion 64 of the first mount 56a, as depicted in FIGS. 10 and 11. An end of the fourth portion 53d of the shuttle 16 adjoins the beam portion 64 of the second mount 56b. The shuttle 16 is thus suspended from, and fully supported by the first and second mounts 56a, 56b by virtue of the mechanical connection between the first portion 53a of the shuttle 16 and the beam portion 64 of the first mount 56a; and the mechanical connection between the fourth portion 53d of the shuttle 16 and the beam portion 64 of the second mount 56b.

The beam portions 64 are configured to deflect so as to facilitate movement of the shuttle 16 in its lengthwise direction, i.e., in the "y" direction. In particular, the shuttle 16 is in its open position when the beam portions 64 are in their neutral, or un-deflected positions, as depicted in FIGS. 10 and 11. The beam portions 64 deflect when the shuttle 16 is urged in the "+y" direction, toward its closed position, due to electrostatic forces developed in the actuator portion 14 as discussed below.

The second portion 53b of the shuttle 16 includes two projections in the form of fingers 74. These fingers 74 form a switch contact and are located on opposite sides of the second portion 53b. The fingers extend substantially perpendicular to the lengthwise direction of the body 52, i.e., in the "+/−x" directions. The shuttle 16 is configured so that one of the fingers 74 faces, and is spaced apart from the first inner conductor 34 by an air gap 76 when the shuttle 16 is in its open position. The other finger 74 faces, and is spaced apart from the second inner conductor 36 by another air gap 76 when the shuttle 16 is in its open position. The air within the air gaps 76 acts as a dielectric insulator that electrically isolates the fingers 74 from the first and second inner conductors 34, 36 when the shuttle 16 is in its open position.

Movement of the shuttle 16 to its closed position causes each of the fingers 74 to traverse and close the associated air gap 76 as the finger 74 moves into contact with its associated first or second inner conductor 34, 36. The electrically-conductive fingers 74 and the adjoining second portion 53b of the body 52 thus bridge the air gaps 76 when the fingers 74 are in contact with the first and second inner conductors 34, 36, thereby establishing electrical contact between the first and second inner conductors 34, 36.

The air gaps 44, 76 act as a dielectric insulator that electrically isolates the first inner conductor 34 from the second inner conductor 38 when the shuttle 16 is in its open position. As shown in FIG. 11, although the second portion 53b of the shuttle 16 extends though the air gap 44 between the second ends 38b, 40b of the first and second inner conductors 34, 36, the second portion 53b does not contact either of the second ends 38b, 40b. Thus, current is not transmitted between the first and second inner conductors 34, 36 via the second portion 53b when the shuttle 16 is in its open position.

By bridging the air gaps 76 when the shuttle 16 is in the closed position, the shuttle 16 electrically connects the first and second inner conductors 34, 36, thereby closing the switch so that electric current can flow there through via a signal path formed by the first and second inner conductors 34, 36 and the second portion 53b of the shuttle 16.

The second portion 53b of the body 52 adjoins the electrically-insulative first and third portions 53a, 53c of the body 52, as depicted in FIGS. 10 and 11. The first portion 53a electrically isolates the second portion 53b from the electrically-conductive first mount 56a. The third portion 53c electrically isolates the second portion 53b from the electrically-conductive fourth portion 53d. Thus, electrical isolation of the signal path through the switch is achieved by way of the air gaps 50 between the first and second inner conductors 34, 36 and the adjacent internal surfaces of the ground housing 28; and by way of the first and third portions 53a, 53c of the shuttle 16.

The actuator portion 14 of the MEMS device 10 includes a body 80, a first lead 82a, and a second lead 82b, as shown in FIG. 10. The body 80 includes two legs 86, and an adjoining top portion 88. The legs 86 are formed as part of the first and second layers of the electrically-conductive material. The top portion 88 is formed as part of the third layer of the electrically-conductive material. The legs 86 are disposed on a surface of the substrate 26, on opposite sides of the ground plane 27 as shown in FIG. 10. The body 80 thus straddles the ground plane 27, and is not in mechanical or electrical contact with the ground plane 27.

The top portion 88 of the body 80 includes a first half 90a and a second half 90b, as depicted in FIG. 10. The first half 90a is associated with one of the legs 86, and the second half 90b is associated with the other leg 86 as shown. The first and second halves 90a, 90b are positioned on opposite sides of the fourth portion 53d of the shuttle 16. The first and second halves 90a, 90b each include three projections in the form of fingers 92 that extend substantially in the "x" direction. The optimal number of fingers 92 is application-dependent, and can vary with factors such as the amount of force that is needed to move the shuttle 16 to its closed position.

The fourth portion 53d of the body 52 of the shuttle 16 includes six projections in the form of fingers 96 that extend substantially in the "x" direction as illustrated in FIG. 10. Three of the fingers 96 are disposed on a first side of the fourth portion 53d, and the other three fingers 96 are disposed on the other side of the fourth portion 53d. The fourth portion 53d and the first and second halves 90a, 90b of the body 80 are configured so that the fingers 92 and the fingers 96 are interleaved or interdigitated, i.e., the fingers 92, 96 are arranged in an alternating fashion along the "y" direction. Moreover, each of the fingers 96 is positioned proximate and associated one of the fingers 92 as depicted in FIG. 10, and is separated from the associated finger 92 by a gap of, for example, approximately 50 μm when the shuttle 16 is in its open position.

The first and second leads 82a, 82b of the actuating portion 14 are disposed on the substrate 26 as shown in FIG. 10, and are formed as part of the first layer of the electrically conductive material. The first lead 82a adjoins the leg 86 associated with the first half 90a of the top portion 88 of the body 80. The second lead 82b adjoins the leg 86 associated with the second half 90b of the top portion 88. The first and second leads 82a, 82b can be electrically connected to a voltage source, such as a 120-volt direct current (DC) voltage source (not shown). Because the first and second halves 90a, 90b of the top portion 88 are in contact with their associated legs 86, energization of the first and second leads 82a, 82b results in energization of the first and second halves 90a, 90b, including the fingers 92.

Subjecting the first and second leads 82a, 82b to a voltage causes the shuttle 16 to move from its open to its closed position, and to remain in the closed position, due to the resulting electrostatic attraction between the shuttle 16 and the actuator portion 14, as follows. As discussed above, the first portion 53a of the shuttle 16 adjoins the beam portion 64 of the first mount 56a, and the fourth portion 53d of the shuttle 16 adjoins the beam portion 64 of the second mount 56b, so that the shuttle 16 is suspended from the first and second mounts 56a, 56b. The beam portions 64 are in their neutral or un-deflected positions when the shuttle 16 is in its open position, as depicted in FIG. 11. Moreover, the fourth portion 53d of the shuttle 16 is electrically connected to the ground plane 26 by way of the second mount 56b, and is electrically isolated from the second portion 53b of the shuttle 16 by the third portion 53c of the shuttle 16. The fourth portion 53d, including the fingers 96 thereof, thus remains in a grounded, or zero-potential state at all times.

Subjecting the first and second leads 82a, 82b of the actuator portion 14 to a voltage potential results in energization of the fingers 92, as discussed above. The energized fingers 92 act as electrodes, i.e., an electric field is formed around each finger 92 due the voltage potential to which the finger 92 is being subjected. Each of the energized fingers 92 is positioned sufficiently close to its associated finger 96 on the grounded shuttle 16 so as to subject the associated finger 96 to the electrostatic force resulting from the electric field around the finger 92. The electrostatic force attracts the finger 96 to its corresponding finger 92.

The net electrostatic force acting on the six fingers 96 urges the shuttle 16 in the "+y" direction. The beam portions 64 of the first and second mounts 56a, 56b, which were in their neutral or un-deflected state prior to energization of the fingers 92, are configured to deflect in response to this force, thereby permitting the suspended shuttle 16 to move in the "+y" direction to its closed position.

The relationship between the amount of deflection and the voltage applied to the actuator portion 14 is dependent upon the stiffness of the beam portions 64, which in turn is dependent upon factors that include the shape, length, and thickness of the beam portions 64, and the properties, e.g., Young's modulus, of the material from which the beam portion 64 are formed. These factors can be tailored to a particular application so as to minimize the required actuation voltage, while providing the beam portion 64 with sufficient strength for the particular application; with sufficient stiffness to tolerate the anticipated levels shock and vibration; and with sufficient resilience to facilitate the return of the shuttle 16 to its open position when the voltage potential to the actuator portion 14 is removed.

The actuator portion 14 can have a configuration other than that described above in alternative embodiments. For example, suitable comb, plate, or other types of electrostatic actuators can be used in the alternative. Moreover, actuators other than electrostatic actuators, such as thermal, magnetic, and piezoelectric actuators, can also be used in the alternative.

FIGS. 12-22 show the process by which the MEMS device 10 can be provided on a base assembly 201 as described herein. Notably, each of FIGS. 12-22 is a split view which shows how corresponding portions of the MEMS device 10 and the waveguide can be constructed concurrently. Specifically, the left side of each view is taken along line B-B in FIG. 11 and the right side of each view is taken along line C-C in FIG. 11.

Figure 12:
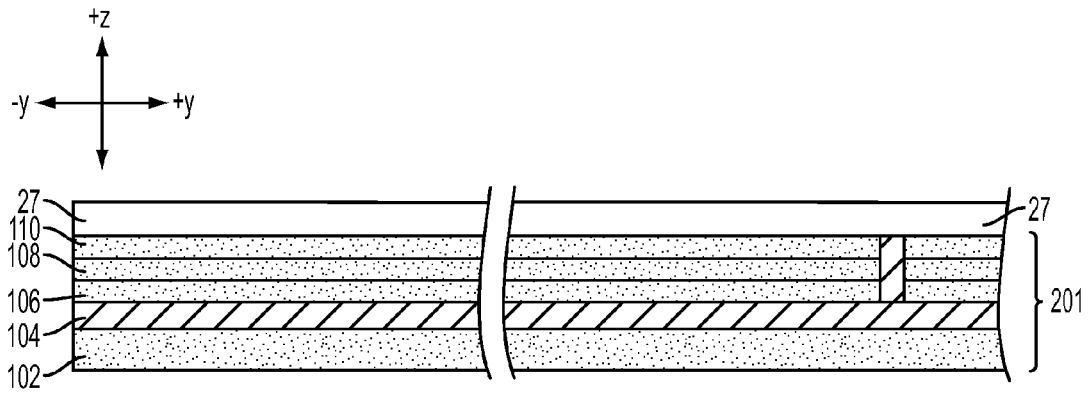
FIGS. 12-22 show a series of processing steps which can be used to construct a MEMS device on the substrate of an RF substrate.
Figure 13:
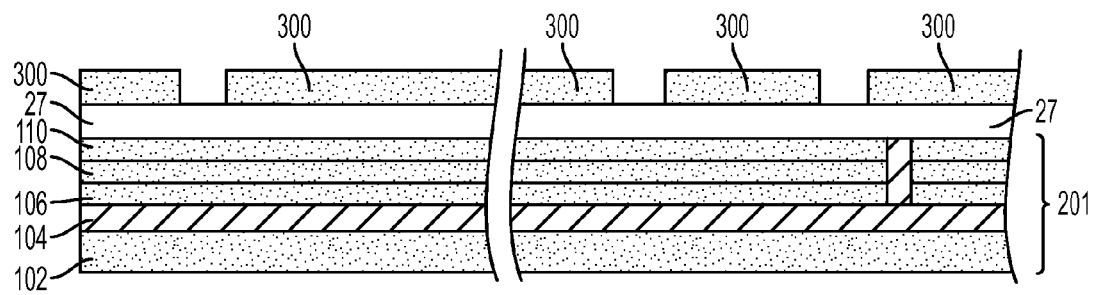

Referring now to FIG. 12, a first layer of electrically conductive material is deposited on the base assembly 201. The electrically conductive material is deposited to form the ground plane 27; a portion of each leg 86 of the body 80 of the actuator portion 14; and a portion of each lead 82a, 82b of the actuator portion 14. A first photoresist layer (not shown) is deposited and patterned on the upper surface of the base assembly 201 so that the only exposed portions of the upper surface correspond to the locations at which the ground plane 27, the legs 86, and leads 82a, 82b are to be located. The first photoresist layer is formed, for example, by depositing photodefinable, or photoresist masking material on the upper surface of the base assembly 201, then patterning and developing.

Electrically-conductive material is subsequently deposited on the exposed, portions of the base assembly 201 to a predetermined thickness, to form the first layer of the electrically-conductive material as shown in FIG. 12, including ground plane 27. The deposition of the electrically-conductive material is accomplished using a suitable technique such as chemical vapor deposition (CVD). Other suitable techniques, such as physical vapor deposition (PVD), sputtering, or electroplating, can be used in the alternative. The newly-formed first layer can be planarized using a suitable technique such as chemical-mechanical planarization (CMP).

Figure 14:
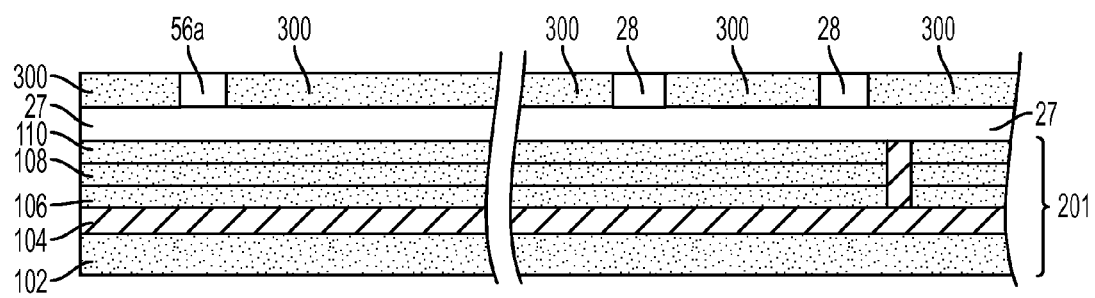

The second layer of the electrically conductive material forms portions of the sides of the ground housing 28; another portion of each leg 86; another portion of the first and second leads 82a, 82b; and a portion of each of the first and second mounts 56a, 56b. A second photoresist layer 300 is deposited and patterned on the partially-constructed MEMS device 10. The electrically-conductive material can subsequently be deposited on the exposed portions of the MEMS device 10 to a predetermined thickness, to form the second layer of the electrically-conductive material as shown in FIG. 14. The upper surfaces of the newly-formed portions of the MEMS device 10 can then be planarized.

Figure 15:
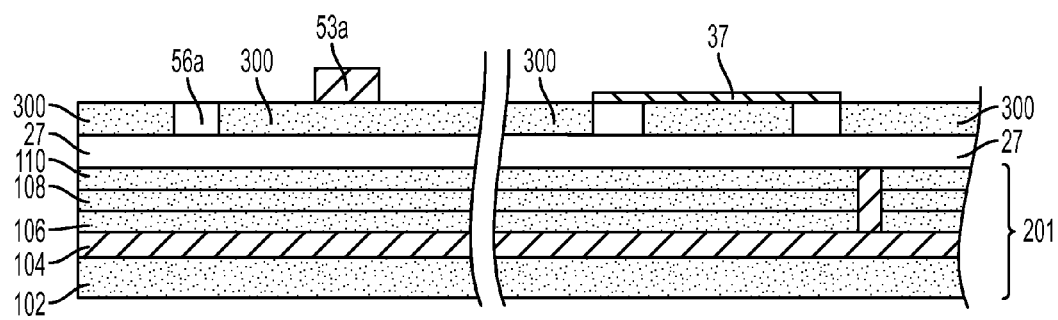
Figure 16:
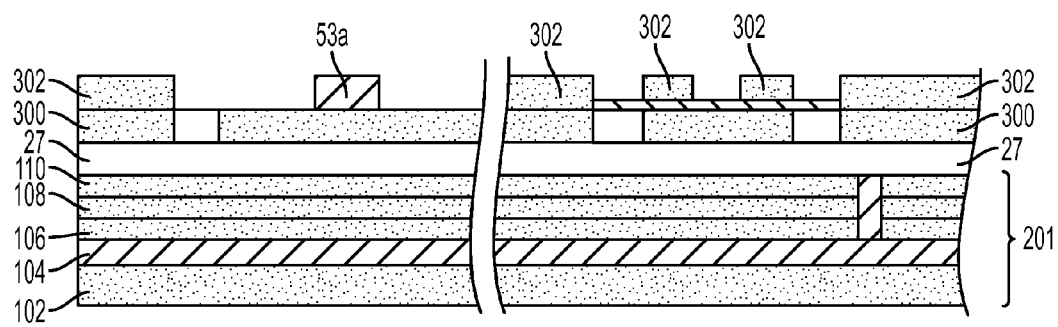

The dielectric material that forms the cross-members 37 is deposited and patterned on top of the previously-formed photoresist layer as shown in FIG. 15. The dielectric material that forms the first and third portions 53a, 53c of the body 52 of the shuttle 16 can be deposited and patterned on top of the previously-formed photoresist layer as also shown in FIG. 15, before or after the cross-members 37 are formed.

Figure 17:
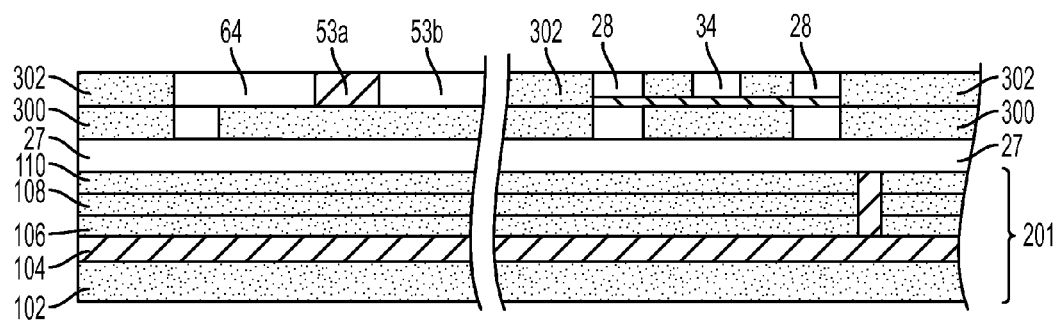
Figure 18:
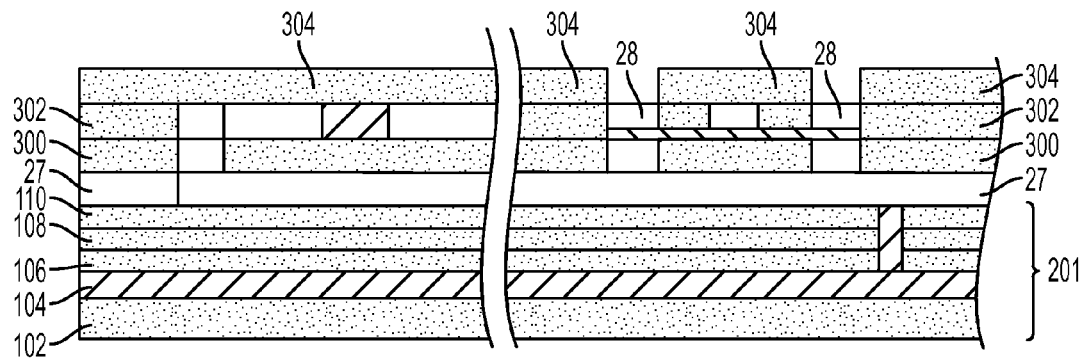
Figure 19:
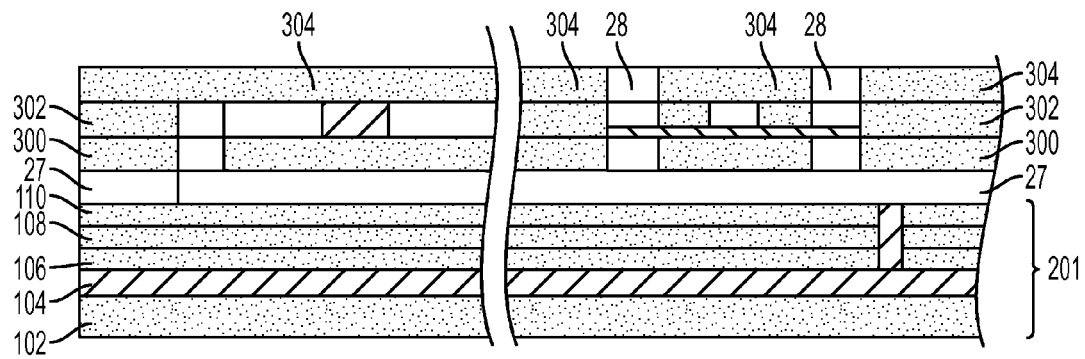
Figure 20:
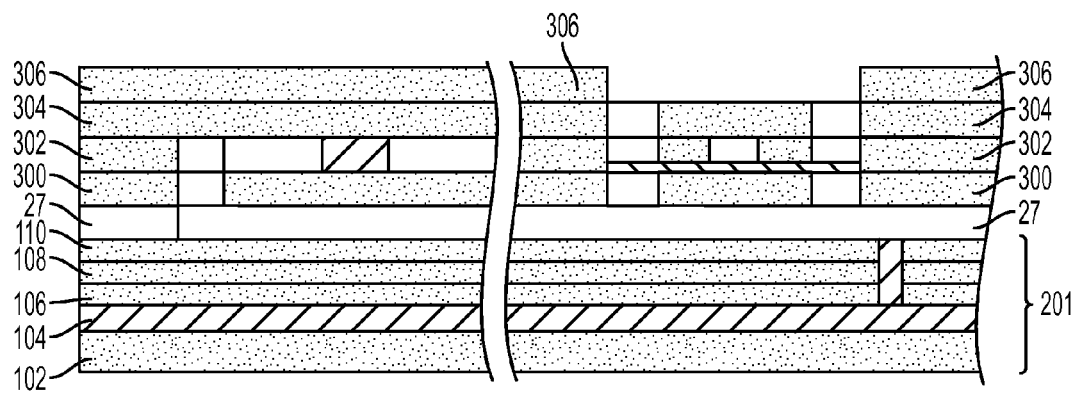
Figure 21:
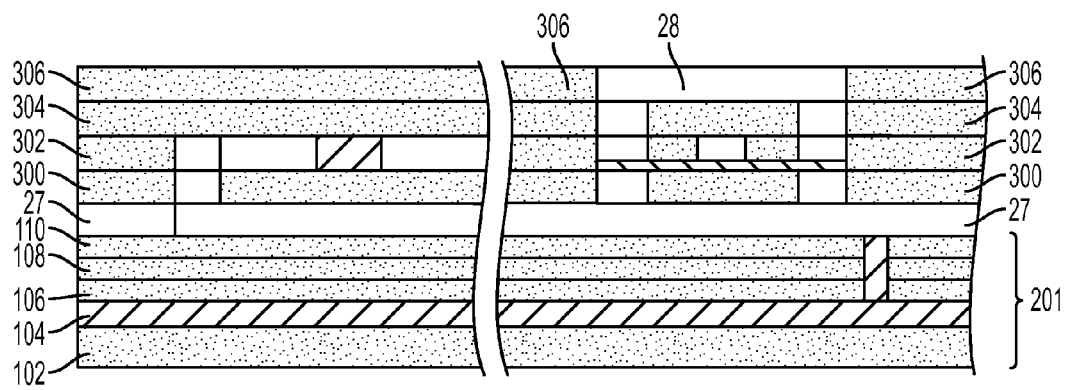

The third layer of the electrically conductive material forms additional portions of the sides of the ground housing 28; the second and fourth portions 53b, 53d of the body 52 of the shuttle 16; additional portions of each of the first and second mounts 56a, 56b; and the top portion 88 of the body 80 of the actuator portion 14. A third photoresist layer 302 is deposited and patterned on the partially-constructed MEMS device 10. The electrically-conductive material can subsequently be deposited on the exposed portions of the MEMS device 10 to a predetermined thickness, to form the third layer of the electrically-conductive material as shown in FIG. 17. The upper surfaces of the newly-formed portions of the MEMS device 10 can then be planarized.

The fourth and fifth layers of the electrically conductive material form, respectively, additional portions of the sides of the ground housing 28, and the top of the ground housing 28. The fourth and fifth layers are formed in a manner similar to the first, second, and third layers. In particular, the fourth and fifth layers are formed by depositing and patterning additional photoresist material to the previously-formed layers, to form fourth and fifth photoresist layers 304, 306 as shown respectively in FIGS. 18 and 20, and then depositing additional electrically-conductive material to the exposed areas to form the fourth and fifth layers as shown respectively in FIGS. 19 and 21. The upper surfaces of the newly-formed portions of the MEMS device 10 can be planarized after the application of each of the fourth and fifth layers.

Figure 22:
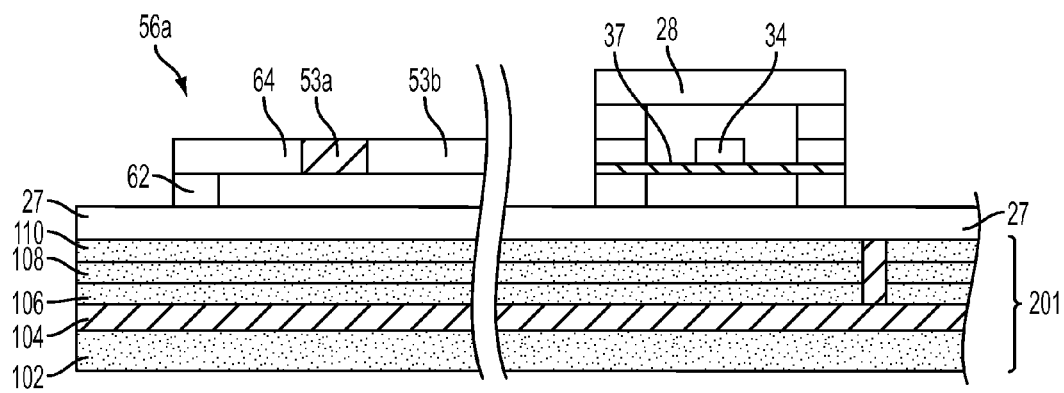

The photoresist material remaining from each of the masking steps can then be released or otherwise removed after the fifth layer has been applied as depicted in FIG. 22, using a suitable technique such as exposure to an appropriate solvent that dissolves the photoresist material. The resulting three-dimensional microstructure is disposed on the surface of a substrate 201 which includes conductive routing traces in thin-film layers on the substrate. The routing traces can be densely routed beneath the surface of the microstructure. For example, the routing traces can be configured to interconnect high voltage DC from a DC to DC converter, to a MEMS device incorporating an electrostatic actuator, with very little ground coupling.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

I claim:

1. A method for constructing a MEMS system, comprising:
    first depositing on a surface of a substrate a first plurality of thin-film layers formed of dielectric material;
    integrating a dense routing network into said first plurality of thin-film layers for communicating control signals to a plurality of MEMS devices by including between two adjacent thin-film layers of said first plurality of thin-film layers at least one conductive trace extending a distance on said substrate, parallel to said surface;
    second depositing over said first plurality of thin-film layers a second plurality of layers including at least one layer each of a conductive material and a dielectric material to form at least one MEMS device which is responsive to a control signal applied to a first input terminal of said MEMS device and which resides above said dense routing network; and
    forming an electrical connection from said at least one conductive trace to said first input terminal.

2. The method according to claim 1, wherein said second depositing step further comprises forming at least one three-dimensional microstructure on a surface of said substrate in addition to said MEMS device.

3. The method according to claim 2, wherein said three-dimensional microstructure is an RF circuit component.

4. The method according to claim 1, further comprising depositing at least one ground plane layer on said substrate prior to depositing said at least one conductive trace.

5. The method according to claim 4, further comprising forming at least one electrical connection in said first plurality of thin film layers from said ground plane layer to a second input terminal of said MEMS device.

6. The method according to claim 1, further comprising disposing at least one integrated circuit component on said substrate electrically connected to said at least one conductive trace.

7. The method according to claim 6, wherein said at least one integrated circuit component is a DC to DC converter.

8. The method according to claim 1, wherein said MEMS device includes an electrostatic actuator.

9. The method according to claim 1, wherein said MEMS device is an RF switch with an electrostatic actuator.

10. The method according to claim 1, wherein said first depositing step and said second depositing step comprise depositing one or more of the same materials and one or more of the same processes.

11. A MEMS system, comprising:
    a first plurality of thin-film layers formed of a dielectric material deposited on a surface of a substrate;
    a dense routing network integrated into said first plurality of thin-film layers for communicating control signals to a plurality of MEMS devices, where the dense routing network comprises at least one conductive trace included between two adjacent thin-film layers of said first plurality of thin-film layers, said at least one conductive trace extending a distance on said substrate, parallel to said surface;
    a second plurality of layers deposited over said first plurality of thin-film layers including at least one layer each of a conductive material and a dielectric material arranged to form at least one MEMS device which is responsive to a control signal applied to a first input terminal of the MEMS device and which resides above said dense routing network; and
    an electrical connection formed from said at least one conductive trace to said input terminal.

12. The MEMS system according to claim 11, wherein said second plurality of layers are deposited by forming at least one three-dimensional microstructure on a surface of said substrate in addition to said MEMS device.

13. The MEMS system according to claim 12, wherein said three-dimensional microstructure is an RF circuit component.

14. The MEMS system according to claim 11, further comprising at least one ground plane layer deposited on said substrate below said at least one conductive trace.

15. The MEMS system according to claim 14, further comprising at least one electrical connection formed in said first plurality of thin-film layers from said ground plane layer to a second input terminal of said MEMS device.

16. The MEMS system according to claim 11, further comprising at least one integrated circuit component disposed on said substrate electrically connected to said at least one conductive trace.

17. The MEMS system according to claim 14, wherein said integrated circuit component is a DC to DC converter.

18. The MEMS system according to claim 11, wherein said MEMS device includes an electrostatic actuator.

* * * * *